United States Patent
Shao et al.

(10) Patent No.: US 12,152,935 B2
(45) Date of Patent: Nov. 26, 2024

(54) HYBRID FIBER FOR DETECTION OF UV LIGHT

(71) Applicant: RENSSELAER POLYTECHNIC INSTITUTE, Troy, NY (US)

(72) Inventors: Dali Shao, Mechanicville, NY (US); Shayla Maya Sawyer, Albany, NY (US); Jie Lian, Niskayuna, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 357 days.

(21) Appl. No.: 17/429,822

(22) PCT Filed: Feb. 11, 2020

(86) PCT No.: PCT/US2020/017609
§ 371 (c)(1),
(2) Date: Aug. 10, 2021

(87) PCT Pub. No.: WO2020/167723
PCT Pub. Date: Aug. 20, 2020

(65) Prior Publication Data
US 2022/0130621 A1    Apr. 28, 2022

Related U.S. Application Data

(60) Provisional application No. 62/972,686, filed on Feb. 11, 2020, provisional application No. 62/803,729, filed on Feb. 11, 2019.

(51) Int. Cl.
*G01J 1/42* (2006.01)
*G01N 30/74* (2006.01)
(Continued)

(52) U.S. Cl.
CPC ............ *G01J 1/429* (2013.01); *G01N 30/74* (2013.01); *H01G 9/2009* (2013.01);
(Continued)

(58) Field of Classification Search
CPC .... G01J 1/42; G01J 1/429; G01N 2203/0641; G01N 30/74
(Continued)

(56) References Cited

U.S. PATENT DOCUMENTS 4,403,826 A * 9/1983 Presby .................. G01J 1/58
385/12
5,349,194 A * 9/1994 Wuest .................. H01J 47/06
250/374
(Continued)

OTHER PUBLICATIONS

Dali Shao et al., Ultrasensitive UV Photodetector Based on Interfacial Charge-Controlled Inorganic Perovskite-Polymer Hybrid Structure, ACS Appl. Mater. Interfaces 2020, 12, 38, 43106-43114. (Year: 2020).*

(Continued)

*Primary Examiner* — Allen C. Ho
(74) *Attorney, Agent, or Firm* — Barclay Damon LLC; Anthony P. Gangemi (57) ABSTRACT

A hybrid fiber for detection of UV light is described. The hybrid fiber includes a conductor, a first layer, a photoactive layer, a second layer, and a transparent electrode. The conductor includes a conductive material. The first layer includes a first material deposited onto the conductor. The first material is configured to transport holes and block electrons. The photoactive layer includes a photoactive material coating the first layer. The photoactive material includes a first submaterial and a second submaterial. The second layer includes a second material deposited onto the photoactive layer. The second material is configured to block holes and transport electrons. The transparent electrode includes a transparent electrode material deposited onto the second layer.

18 Claims, 4 Drawing Sheets

(51) Int. Cl.
*H01G 9/20* (2006.01)
*H10K 30/30* (2023.01)
*H10K 30/82* (2023.01)
*H10K 85/30* (2023.01)
*H10K 85/60* (2023.01)

(52) U.S. Cl.
CPC ......... *H01G 9/2086* (2013.01); *H10K 30/353* (2023.02); *H10K 30/82* (2023.02); *H10K 85/30* (2023.02); *H10K 85/657* (2023.02); *G01N 2203/0641* (2013.01)

(58) Field of Classification Search
USPC ........................................................ 250/372
See application file for complete search history.

(56) References Cited

U.S. PATENT DOCUMENTS

| | | | | |
|---|---|---|---|---|
| 6,485,687 | B1* | 11/2002 | Spangenberg | G01N 30/95 422/82.11 |
| 7,194,173 | B2* | 3/2007 | Shtein | H10K 30/451 385/128 |
| 7,514,693 | B2* | 4/2009 | Lee | G01J 1/429 250/372 |
| 7,834,545 | B2* | 11/2010 | Zhang | H10K 50/81 313/506 |
| 8,742,398 | B2* | 6/2014 | Klem | H10K 30/10 257/E31.058 |
| 9,130,170 | B2* | 9/2015 | Forrest | H10K 71/80 |
| 9,349,970 | B2 | 5/2016 | Klem et al. | |
| 9,891,380 | B1* | 2/2018 | Winarski | D01F 11/10 |
| 10,069,095 | B2* | 9/2018 | Forrest | H10K 30/353 |
| 10,145,029 | B2 | 12/2018 | Zhou et al. | |
| 10,199,588 | B2* | 2/2019 | Belcher | H10K 30/20 |
| 10,273,405 | B2* | 4/2019 | Weidman | C07F 7/2208 |
| 10,276,310 | B2* | 4/2019 | Ha | G01J 1/429 |
| 10,276,817 | B2* | 4/2019 | Forrest | H10K 30/353 |
| 10,297,775 | B2* | 5/2019 | Lassiter | B82Y 10/00 |
| 10,580,585 | B2* | 3/2020 | Snaith | H10K 30/15 |
| 10,622,161 | B2* | 4/2020 | Huang | H01G 9/0036 |
| 10,622,162 | B2* | 4/2020 | Snaith | H10K 71/12 |
| 2017/0053746 | A1 | 2/2017 | Belcher et al. | |
| 2017/0148579 | A1 | 5/2017 | Snaith et al. | |
| 2017/0217785 | A1 | 8/2017 | Yang et al. | |
| 2017/0229249 | A1 | 8/2017 | Snaith et al. | |
| 2017/0321117 | A1 | 11/2017 | Weidman et al. | |
| 2018/0151303 | A1 | 5/2018 | Maimon | |

OTHER PUBLICATIONS

International Search Report and The Written Opinion of the International Searching Authority, International Application No. PCT/US2020/017609, mailed May 11, 2020.

Shao, D., et al., "High-Performance Ultraviolet Photodetector Based on Organic-Inorganic Hybrid Structure," ACS Applied Materials & Interfaces, vol. 6, No. 16, pp. 14690-14694, Jul. 2, 2014.

De Sanctis, A., et al., "Graphene-based light sensing: fabrication, characterisation, physical properties and performance," Materials, vol. 11, No. 9, pp. 1-30, Sep. 18, 2018.

Tan, Z., et al., "Highly Efficient Blue-Emitting Bi-Doped Cs2SnCl6 Perovskite Variant: Photoluminescence Induced by Impurity Doping," Advanced Functional Materials, vol. 28, No. 29, pp. 1-10, May 21, 2018.

* cited by examiner

HYBRID FIBER FOR DETECTION OF UV LIGHT

CROSS REFERENCE TO RELATED APPLICATION(S)

This application claims the benefits of U.S. Provisional Application No. 62/803,729, filed Feb. 11, 2019, and U.S. Provisional Application No. 62/972,686, filed Feb. 11, 2020, which are incorporated by reference as if disclosed herein in their entireties.

GOVERNMENT LICENSE RIGHTS

This invention was made with government support under award no. DE-SC0016584, awarded by the United States Department of Energy. The government has certain rights in the invention.

FIELD

The present disclosure relates to detection of ultraviolet (UV) light, in particular to, a hybrid fiber for detection of UV light.

BACKGROUND

Ultraviolet (UV) photodetectors have a wide range of applications including, but not limited to, secure space-to-space communications, pollution monitoring, water sterilization, flame sensing and early missile plume detection. Generally, most commercial UV photodetectors are made from silicon, silicon carbide or gallium nitride p-n junction photodiodes. Such UV photo-detectors can be relatively high cost and have detectivities in the range of less than about $5 \times 10^{13}$ jones). Photo-multiplication tubes (PMTs) can achieve relatively high detectivity (i.e., about $3 \times 10^{14}$ jones) in the UV and visible regions. PMTs have a relatively low UV to visible rejection ratio, a relatively high operating voltage (e.g., on the orders of hundreds to thousands of volts) and may occupy a relatively large physical volume.

SUMMARY

In an embodiment, there is provided a hybrid fiber for detection of UV light. The hybrid fiber includes a conductor, a first layer, a photoactive layer, a second layer, and a transparent electrode. The conductor includes a conductive material. The first layer includes a first material deposited onto the conductor. The first material is configured to transport holes and block electrons. The photoactive layer includes a photoactive material coating the first layer. The photoactive material includes a first submaterial and a second submaterial. The second layer includes a second material deposited onto the photoactive layer. The second material is configured to block holes and transport electrons. The transparent electrode includes a transparent electrode material deposited onto the second layer.

In operation, with reverse bias voltage across the conductor and the transparent electrode, when the UV light photodetector is not illuminated, the second layer and the transparent electrode are configured to impede hole injection and the conductor and the first layer are configured to impede electron injection, resulting in a dark current corresponding to a dark current density less than or equal to a dark current density threshold. When the 11V light photodetector is illuminated by UV light, the second layer and the transparent electrode are configured to allow hole injection in response to operation of the photoactive layer, resulting in a photocurrent density of at least three orders of magnitude greater than the current density threshold.

In some embodiments of the hybrid fiber, the dark current density threshold is in the range of $10^{-6}$ to $10^{-5}$ A/cm$^2$ (amperes per centimeter squared). In some embodiments of the hybrid fiber, the first submaterial is a wide bandgap semiconductor material and the second submaterial is configured to transport holes and to block electrons. In some embodiments of the hybrid fiber, an operating voltage corresponding to the bias voltage is less than 20 volts. In some embodiments of the hybrid fiber, the conductor is flexible.

In some embodiments of the hybrid fiber, the conductive material is selected from the group comprising graphene, poly(3,4-ethylenedioxythiophene) polystyrene sulfonate ("PEDOT/PSS"); poly[2-methoxy-5-(2-ethythexyloxy)-1,4-phenylenevinylene]) ("MEH-PPV"), metal or a carbon nanotube; the first material is selected from the group comprising molybdenum trioxide (MoO$_3$), 2,2',7,7'-Tetra(N,N-di-p-tolyl)amino-9,9-spirobifluorene ("Spiro-TTB"); N,N'-Bis(naphthalen-1-yl)-N,N'-bis(phenyl)-benzidine ("NPB"); N,N'-Bis(3-methylphenyl)-N,N'-bis(phenyl)-benzidine ("TPD"), nickel oxide (NiO), copper oxide (CuO); the photoactive material first submaterial is selected from the group comprising Cs$_2$SnCl$_6$, Cs$_2$SnCl$_6$ doped with Bismuth (Bi), Indium oxide (In$_2$O$_3$), Tungsten oxide (WO$_3$); the photoactive material second submaterial is selected from the group comprising poly(N-vinylcarbazole (PVK), Spiro-TTB, NPB, TPD, NiO, CuO, 1,1-bis[(di-4-tolylamino)phenyl]cyclohexane (TAPC); the second material is selected from the group comprising bathocuproine ("BCP"), Bathophenanthroline ("BPhen"), Diphenyl[4-(triphenylsilyl)phenyl]phosphine oxide ("TSPO1"), Titanium dioxide (TiO$_2$); and the transparent electrode material is selected from the group comprising a carbon nanotube network, graphene, tin-doped indium oxide ("ITO"); aluminium-doped zinc oxide ("AZO"), fluorine-doped tin oxide ("FTO").

In some embodiments of the hybrid fiber, a detectivity is on the order of $10^{15}$ jones, a response time is less than 1 microsecond, and a linear dynamic range is on the order of 100 decibels (dB).

In some embodiments of the hybrid fiber, the photoactive layer is coated onto the first layer by a coating process selected from the group comprising dip, spin, spray, electrochemical and self-adsorption.

In some embodiments of the hybrid fiber, the first submaterial comprises a perovskite material. In some embodiments of the hybrid fiber, the perovskite material comprises Cs$_2$SnCl$_6$. In some embodiments of the hybrid fiber, the perovskite material further comprises Bismuth (Bi). In some embodiments of the hybrid fiber, the second submaterial is PVK (poly(N-vinylcarbazole) or TACP (1,1-bis[(di-4-tolylamino)phenyl]cyclohexane).

In an embodiment, there is provided a hybrid fiber for detection of UV light. The hybrid fiber includes a conductive fiber, a first layer, a photoactive layer, a second layer, and a transparent electrode. The conductive fiber includes a graphene material. The first layer includes Molybdenum trioxide (MoO$_3$) deposited onto the conductive fiber. The MoO$_3$ is configured to transport holes and block electrons. The photoactive layer includes a photoactive material coating the first layer. The photoactive material includes a perovskite material and poly(N-vinylcarbazole) (PVK) or 1,1-bis[(di-4-tolylamino)phenyl]cyclohexane (TAPC). The second layer includes a bathocuproine ("BCP") material deposited onto the photoactive layer. The BCP material is configured to block holes and transport electrons. The transparent electrode includes a multiwall carbon nanotube material or a graphene quantum dot material. The transparent electrode is deposited onto the second layer.

In operation, with reverse bias voltage across the conductive fiber and the transparent electrode, when the UV light photodetector is not illuminated, the second layer and the transparent electrode are configured to impede hole injection and the conductive fiber and the first layer are configured to impede electron injection, resulting in a dark current corresponding to a dark current density less than or equal to a dark current density threshold. When the UV light photodetector is illuminated by UV light, the second layer and the transparent electrode are configured to allow hole injection in response to operation of the photoactive layer, resulting in a photocurrent density of at least three orders of magnitude greater than the dark current density threshold.

In some embodiments of the hybrid fiber, the dark current density threshold is in the range of $10^{-6}$ to $10^{-5}$ A/cm$^2$ (amperes per centimeter squared). In some embodiments of the hybrid fiber, an operating voltage corresponding to the bias voltage is less than 20 volts. In some embodiments of the hybrid fiber, the conductor is flexible.

In some embodiments of the hybrid fiber, a detectivity is on the order of $10^{15}$ jones, a response time is less than 1 microsecond, and a linear dynamic range is on the order of 100 decibels (dB).

In some embodiments of the hybrid fiber, the photoactive layer is coated onto the first layer by a coating process selected from the group comprising dip, spin, spray, electrochemical and self-adsorption. In some embodiments of the hybrid fiber, the perovskite material comprises $Cs_2SnCl_6$. In some embodiments of the hybrid fiber, the perovskite material further comprises Bismuth (Bi).

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

DETAILED DESCRIPTION

Perovskite materials are synthetic compounds that have an orthorhombic crystal structure identical to a naturally occurring mineral with the same name and that share a structurally similar chemical formula. Perovskite materials have enabled relatively high performance optoelectronic devices including, but not limited to, broadband tunable light-emitting diodes, relatively sensitive photodetectors, and solar cells that have reached high power conversion efficiencies above 20%. The relatively high performance characteristics in some optoelectronic devices are due to their high carrier mobility, large optical absorption coefficient, and a relatively long carrier recombination lifetime. For example, perovskite-based hybrid material systems may be used in photodetector applications as they offer a relatively inexpensive technology for manufacturing while at the same time are able to achieve relatively high detectivities (e.g., on the orders of $10^{13}$-$10^{14}$ jones), a relatively large linear dynamic range (e.g., over 100 dB), and relatively fast response speed (e.g., on the order of microseconds (µs)). However, most perovskite materials are not visible-blind, a characteristic that is related to their relatively narrow bandgap. The detectivities of the perovskites are relatively low compared to PMT since perovskites generally lack an efficient internal gain mechanism. Such detectivities may limit their capability for detection of a relatively weak light signal.

Generally, an apparatus, method and/or system consistent with the present disclosure includes a hybrid fiber for detection of UV light. In an embodiment, the hybrid fiber photodetector may include an interfacial charge valve configured for relatively highly, sensitive detection of UV light. A hybrid fiber photodetector consistent with the present disclosure may include a visible-blind hybrid fiber configured to provide a relatively high detectivity, a relatively fast response time, and a relatively large linear dynamic range.

A photoactive layer of a hybrid fiber photodetector, consistent with the present disclosure, may include a blend of a wide band gap semiconductor nanomaterial and a hole transport/electron blocking organic or inorganic material. The photoactive composite layer is configured to act a photo-sensitive charge-valve that controls hole injection in an anode of the photodetector. This mechanism supports achieving a relatively low noise current and a relatively high external quantum efficiency at the same time. The relatively low noise current and relatively high external quantum efficiency thus support detectivity in the UV region. The hybrid UV photodetector is configured to be flexible and mechanically durable. In one nonlimiting example, a hybrid fiber photodetector consistent with the present disclosure may provide relatively stable UV sensing performance with more than 300 cycles of +/−45° bending. A hybrid fiber photodetector, consistent with the present disclosure, may thus be useful in a variety of micro system integrations.

In one embodiment, there is provided a hybrid fiber for detecting ultraviolet (UV) light. The hybrid fiber includes a conductor, a first layer, a photoactive layer, a second layer and a transparent electrode. The conductor includes a conductive material. The first layer includes a first material deposited onto the conductor. The first material is configured to transport holes and block electrons. The photoactive layer includes a photoactive material coating the first layer. The photoactive material includes a first submaterial and a second submaterial. The second layer includes a second material deposited onto the photoactive layer. The second material is configured to block holes and transport electrons. The transparent electrode includes a transparent electrode material deposited onto the second layer.

In operation, a reverse bias voltage may be applied across the conductor and the transparent electrode. In one nonlimiting example, a supply voltage (i.e., operating voltage) corresponding to the bias voltage may be less than 20 volts (V). When the UV light photodetector is not illuminated, the second layer and the transparent electrode are configured to impede hole injection and the conductor and the first layer are configured to impede electron injection, resulting in a dark current corresponding to a dark current density less than or equal to a dark current density threshold. In one nonlimiting example, the dark current density threshold may be on the order of $10^{-6}$ A/cm² (amperes per centimeter squared). When the UV light photodetector is illuminated by UV light, the second layer and the transparent electrode are configured to allow hole injection in response to operation of the photoactive layer, resulting in a photocurrent density of at least three orders of magnitude greater than the dark current density threshold.

Figure 1:
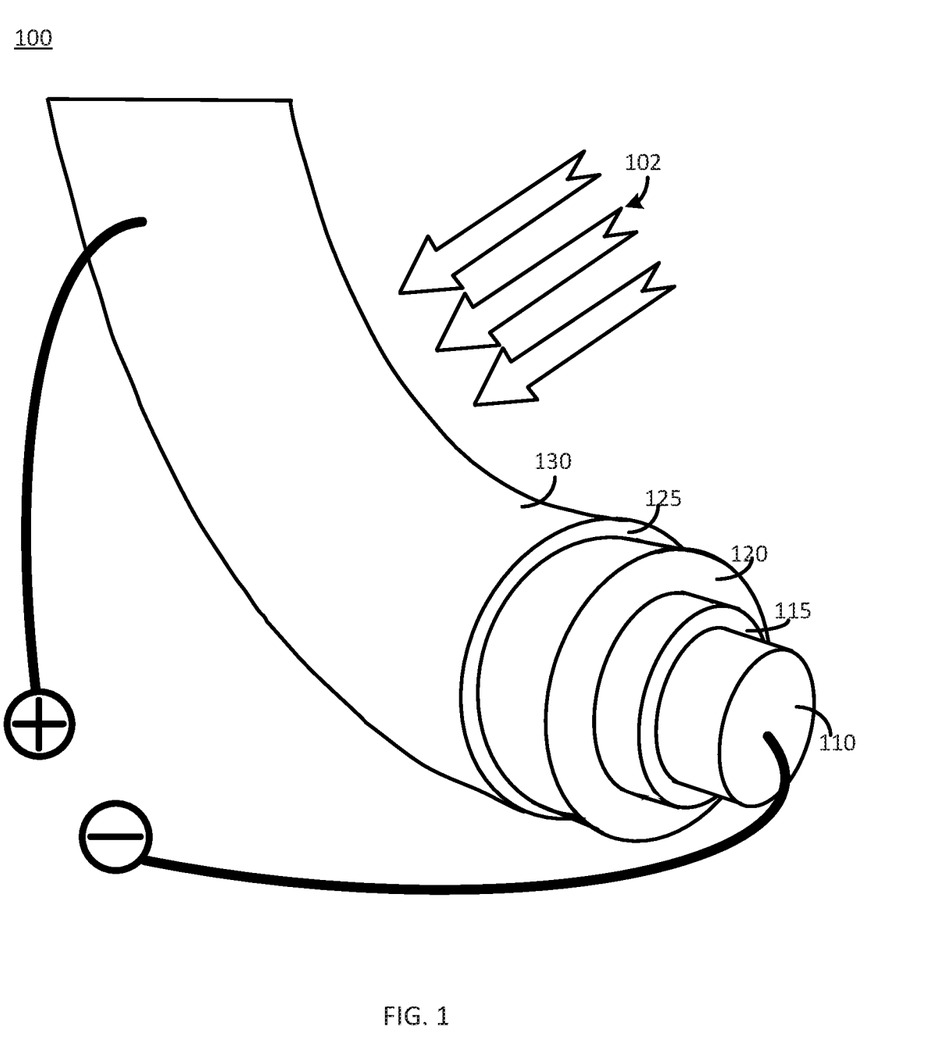
FIG. 1 is a sketch of a hybrid fiber for detection of UV light consistent with several embodiments of the present disclosure.

FIG. 1 is a sketch of a hybrid fiber 100 for detection of UV light 102 consistent with several embodiments of the present disclosure. The hybrid fiber 100 may correspond to or be included in a UV light photodetector. The hybrid fiber 100 includes a conductor 110, a first layer 115, a photoactive layer 120, a second layer 125 and a transparent electrode 130.

In an embodiment, the conductor 110 may be flexible. The conductor 110 may be formed of a relatively highly conductive material. The conductive material may be organic or inorganic. In an embodiment, the conductive material may include graphene. The conductor 110 may thus correspond to a graphene fiber when the conductive material is graphene. The graphene fiber may then be flexible. In one nonlimiting example, a graphene fiber may be synthesized using a relatively high temperature reduction of intermixed large-sized and small-sized graphene oxide (GO) configured to provide an optimum electrical conductivity and mechanical strength. In some embodiments, the conductive material may include an organic conductive material (e.g., poly(3,4-ethylenedioxythiophene) polystyrene sulfonate ("PEDOT/PSS"); poly[2-methoxy-5-(2-ethylhexyloxy)-1,4-phenylenevinylene]) ("MEH-PPV"), or an inorganic conductive material such as a metal (e.g., copper, silver, stainless steel, etc.) or a carbon nanotube.

The first layer 115 includes a first material. The first material may be deposited onto the conductor 110. In one nonlimiting example, the first material may be deposited onto the conductor 110 using thermal evaporation. The first material may be organic or inorganic. The first material is configured to transport holes and block electrons. Thus, the first material corresponds to a hole transport/electron blocking material and the first layer 115 corresponds to a hole transport/electron blocking layer. In an embodiment, the first material may include molybdenum trioxide ($MoO_3$). In one nonlimiting example, the $MoO_3$ may be deposited using thermal evaporation and may have a thickness of approximately 10 nm. In some embodiments, the first material may include an organic material (e.g., 2,2',7,7'-Tetra(N,N-di-p-tolyl)amino-9,9-spirobifluorene ("Spiro-TTB"); N,N'-Bis(naphthalen-1-yl)-N,N'-bis(phenyl)-benzidine ("NPB"); N,N'Bis(3-methylphenyl)-N,N'-bis(phenyl)-benzidine ("TPD")), or an inorganic material (e.g., nickel oxide (NiO), copper oxide (CuO)).

The photoactive layer 120 includes a photoactive material. The photoactive material may be coating the first layer 115. The photoactive material may include a blend of submaterials. In an embodiment, the photoactive material may include a blend of a wide bandgap semiconductor nanomaterial and a hole transport/electron blocking organic or inorganic material. The wide bandgap semiconductor nanomaterial may then correspond to the first submaterial and the hole transport/electron blocking organic or inorganic material may correspond to the second submaterial. In an embodiment, the first submaterial may include a blend of a perovskite material (e.g., $Cs_2SnCl_6$) and Bi (Bismuth). $Cs_2SnCl_6$ corresponds to a wide-bandgap vacancy-ordered inorganic perovskite. In one nonlimiting example, the blend of $Cs_2SnCl_6$ may be in the form of nanoparticles (NPs) doped with Bi. In an embodiment, the photoactive material may include a blend of a perovskite material (e.g., $Cs_2SnCl_6$ that may be doped with Bi) and PVK (poly(N-vinylcarbazole). In this embodiment, the PVK corresponds to the second submaterial. It may be appreciated that $Cs_2SnCl_6$ has a crystal structure corresponding to a vacancy-ordered double perovskite structure with isolated [$SnCl_6$] octahedral. In some embodiments, the photoactive material may include a blend of a wide band gap semiconductor nanomaterial (e.g., Indium oxide ($In_2O_3$), Tungsten oxide ($WO_3$)) and a hole transport/electron blocking material. The hole transport/electron blocking material may be an organic material (e.g., Spiro-TTB, NPB, TPD, as described herein), or an inorganic material (e.g., NiO, CuO, as described herein).

In an embodiment, the blend of materials of the photoactive layer 120 may be dispersed in a solvent and coated onto the first layer 115 (and conductor 110) using a coating process. The coating process may include, but is not limited to, dip coating, spin coating, spray coating electrochemical coating or self-adsorption coating.

The second layer 125 includes a second material. The second material may be deposited onto the photoactive layer 120. The second material may be organic or inorganic. The second material may be configured to transport electrons and block holes. Thus, the second material corresponds to an electron transport/hole blocking material and the second layer 125 corresponds to an electron transport/hole blocking layer. In an embodiment, the second material may include bathocuproine ("BCP"), an organic electron transport/hole blocking material. In some embodiments, the second material may include an organic material (e.g., Bathophenanthroline ("BPhen"), Diphenyl[4-(triphenylsilyl)phenyl]phosphine oxide ("TSPO1")), or an inorganic material (e.g., Titanium dioxide ($TiO_2$)).

The transparent electrode 130 includes a transparent electrode material. The transparent electrode material may be deposited onto the second layer 125. In some embodiments, the transparent electrode material may include a carbon nanotube network. In these embodiments, the carbon nanotube network may be single wall or multiwall. In some embodiments, the transparent electrode material may include graphene. In these embodiments, the graphene may be monolayer, bilayer or may include quantum dots. In some embodiments, the electrode material may include another transparent electrode material (e.g., tin-doped indium oxide ("ITO"); aluminium-doped zinc oxide ("AZO"), fluorine-doped tin oxide ("FTO")).

In operation, a reverse bias voltage may be applied between the conductor 110 and the transparent electrode 130 (i.e., reverse bias conditions). When the UV light photodetector 100 is not illuminated (i.e., UV light 102 is not present), the second layer 125 and the transparent electrode 130 are configured to impede hole injection and the conductor 110 and the first layer 115 are configured to impede electron injection. A relatively low dark current may then result. As used herein, a relatively low dark current means a dark current density less than or equal to a dark current density threshold. In an embodiment, the dark current threshold may corresponds to a dark current density threshold of on the order of $10^{-6}$ A/cm² (amperes per centimeter squared). In another embodiment, the dark current density threshold may be on the order of $10^{-5}$ A/cm². In one nonlimiting example, the reverse bias voltage may be in the range of −1 volt (V) to −20 V; i.e., an operating voltage of less than or equal to 20 V. In another example, the reverse bias voltage may be in the range of −2 V to −15 V, corresponding to an operating voltage range of 2 V to 15 V.

Conversely, when the UV light photodetector 100 is illuminated by UV light 102 and under reverse bias conditions, the second layer 125 and the transparent electrode 130 are configured to allow hole injection in response to operation of the photoactive layer. The photoactive layer 120 is configured to operate in response to UV illumination. A photocurrent density of a number of orders of magnitude greater than the dark current density threshold may then result. In an embodiment, the photocurrent density may be at least two orders of magnitude greater than the dark current threshold. In one nonlimiting example, the photocurrent density may be six orders of magnitude greater than the dark current threshold. In another nonlimiting example, the photocurrent density may be five orders of magnitude greater than the dark current threshold. In another nonlimiting example, the photocurrent density may be three orders of magnitude greater than the dark current threshold.

Figure 2A:
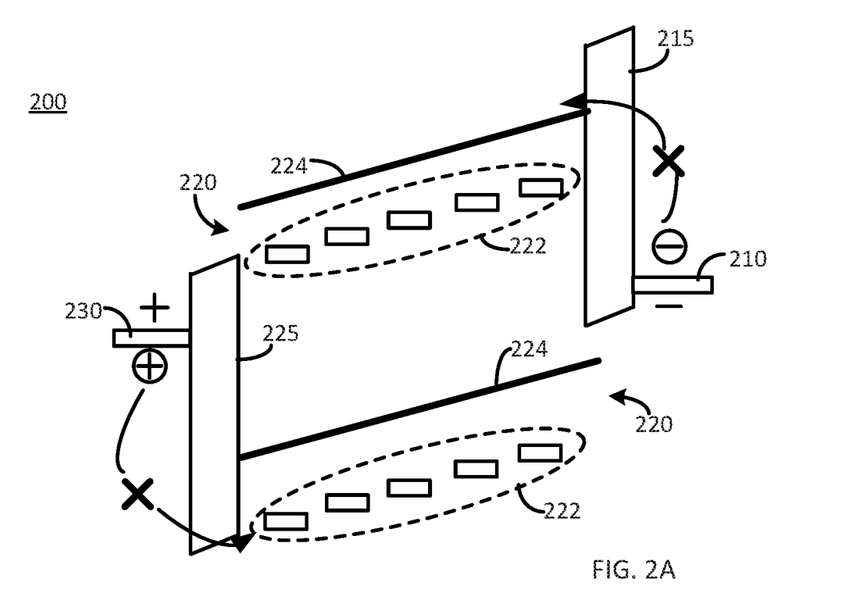
FIGS. 2A and 2B are sketches of energy band diagrams, illustrating carrier transport processes in the dark and with UV illumination, respectively, of the hybrid fiber photodetector of FIG. 1, consistent with several embodiments of the present disclosure.
Figure 2B:
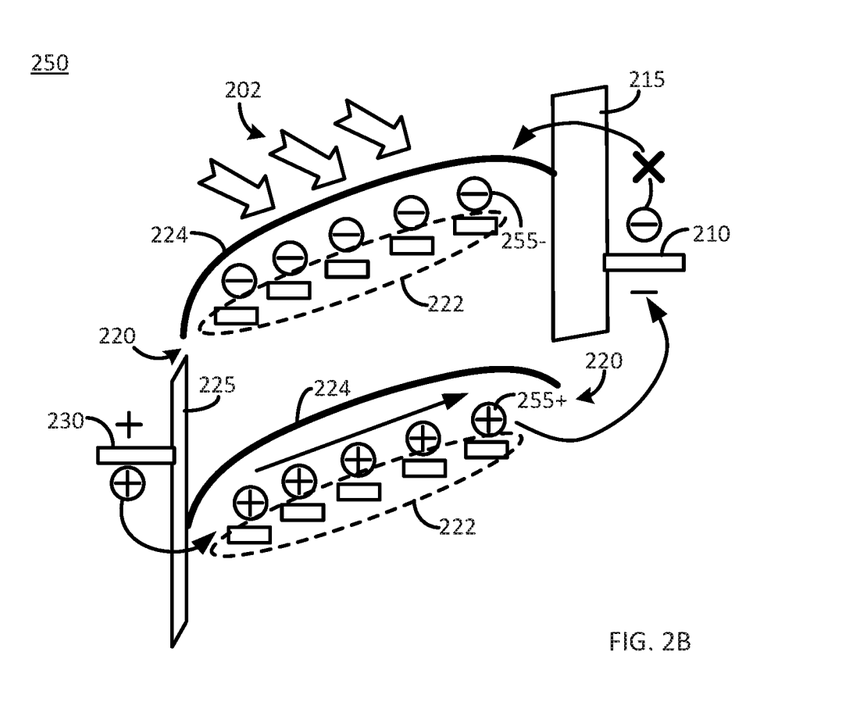

FIGS. 2A and 2B are sketches of energy band diagrams, illustrating carrier transport processes in the dark 200 and with UV illumination 250, respectively, of the hybrid fiber photodetector of FIG. 1, consistent with several embodiments of the present disclosure. FIGS. 2A and 2B may be best understood when considered together. Sketch ("dark") 200 and sketch ("UV illumination") 250 correspond to hybrid fiber 100 of FIG. 1 without illumination (dark) 200 and with UV illumination 250, respectively. Dark sketch 200 and UV illumination sketch 250 include representations of a conductor 210, a first layer 215 and a transparent electrode 230, corresponding to the conductor 110, the first layer 115 and the transparent electrode 130, respectively, of FIG. 1. Dark sketch 200 and UV illumination sketch 250 further include representations of a photoactive layer 220 and a second layer 225. The photoactive layer 220 includes a first submaterial 222 and a second submaterial 224 corresponding to the blend of submaterials described with respect to FIG. 1. In one nonlimiting example, the first submaterial 222 may be a perovskite and the second submaterial 224 may be PVK. In another nonlimiting example, the first submaterial 222 may be a perovskite and the second submaterial 224 may be TAPC (1,1-bis[(di-4-tolylamino)phenyl]cyclohexane).

Turning now to FIG. 2A, without UV illumination, under reverse bias conditions (i.e., with an operating voltage coupled to and configured to provide a reverse bias voltage across conductor 210 and transparent electrode 230), the hole blocking ability of the second layer 225, together with the relatively large band offset between the HOMO (i.e., highest occupied molecular orbital, equivalent to valence band maximum) of the second layer 225 and work function of the transparent electrode 230, are configured to impede hole injection from the transparent electrode 230. Similarly, electron injection from the conductor 210 may be suppressed due to the electron blocking ability of the first layer 215 together with the relatively large band offset between the work function of conductor 210 material and the conduction band minimum of the first layer 215. It may be appreciated that the carrier injection blocking capability at both electrode terminals 210, 230 may enable a relatively low dark current. The relatively low dark current supports a relatively high detectivity of a hybrid fiber UV photodetector, consistent with the present disclosure.

Turning now to FIG. 2B, upon UV illumination 202, the first submaterial 222 is configured to absorb incident photons from the UV light 202 and generate electron-hole pairs, e.g., electron (255−)-hole (255+) pair. The photogenerated holes, e.g., hole 255+, from the first submaterial 222 may be transported through the second submaterial 224 and the first layer, and be collected from the conductor 210 under the external bias voltage (i.e., the supply voltage). In contrast, the photogenerated electrons, e.g., electron 255−, remain confined in the first submaterial 222 due to lack of a percolation network for electrons and a relatively strong electron confinement effect of the photoactive composite layer 220. In other words, a relatively large band offset between the LUMO (i.e., lowest unoccupied molecular orbital, equivalent to conduction band minimum) of the second submaterial 224 and conduction band minimum of the first submaterial 222, together with the electron blocking capability of the second submaterial 224 may effectively confine the photogenerated electrons, e.g., electron 255−, in the photoactive composite layer 220. The confined electrons may accumulate and relatively quickly shift the LUMO of the second layer 225 downwards. The hole-injection barrier of the second layer 225 near the transparent electrode 230 may then become relatively thin. The holes may then relatively easily tunnel through the hole injection barrier of the second layer 225 with a small reverse bias. Accordingly, an interface between the second layer 225 and the transparent electrode 230 may be understood to act as a 'valve' for hole injection that is controlled by the photoactive composite layer 220. It may be further understood that incident photons (from UV light 202) may switch on this 'valve' allowing the flow of holes.

Thus, a hybrid fiber UV photodetector, consistent with the present disclosure, may provide relatively high external quantum efficiency and detectivity, a relatively fast response speed, and a relatively large linear dynamic range. The performance is related to the interfacial charge-valve controlled carrier injection mechanism, as described herein, that facilitates the relatively high external quantum efficiency and suppressed dark current at the same time.

In one nonlimiting example, at room temperature, a hybrid fiber photodetector consistent with the present disclosure may have a detectivity on the order of $10^{15}$ jones at a UV wavelength of 324 nanometers (nm), In another nonlimiting example, a hybrid fiber photodetector consistent with the present disclosure may have a response time (i.e., rise and fall time) on the order of hundreds of nanoseconds (ns). In another nonlimiting example, a hybrid fiber photodetector consistent with the present disclosure may have a linear dynamic range of 125 decibels (dB).

EXAMPLE

An example hybrid fiber UV photodetector, consistent with the present disclosure was constructed and tested. The example UV photodetector included a graphene fiber conductor, synthesized using high temperature reduction of intermixed large-sized and small-sized graphene oxide (GO) for optimized electrical conductivity and mechanical strength.

The first layer corresponded to a thin layer of $MoO_3$ with thickness of approximate 10 nm. The $MoO_3$ was deposited onto the graphene fiber using thermal evaporation with a deposition rate at ~0.5 A/s. The $MoO_3$ is configured as a hole transport/electron blocking layer, as described herein. The photoactive layer included blends of Bi doped $Cs_2SnCl_6$ nanoparticles ($Cs_2SnCl_6$:Bi NPs) with soluble 1,1-bis[(di-4-tolylamino)phenyl] cyclohexane (TAPC) at the ratio of 3:1 by weight. The TAPC-$Cs_2SnCl_6$:Bi NPs blends were dispersed in dichlorobenzene solvent (45 mg/mL) and coated to fiber using a typical dip coating method. SEM images illustrated that TAPC-$Cs_2SnCl_6$:Bi NPs blends were uniformly coated onto the fiber.

A second layer included a 20 nm thick bathocuproine (BCP) layer. The BCP layer was deposited to cover the TAPC-$Cs_2SnCl_6$:Bi NPs composite layer through thermal evaporation. The BCP layer is configured to act as an electron transport/hole blocking layer, as described herein. The transparent electrode in this example included graphene quantum dots (GQDs). The BCP layer was coated with GQDs by dipping into freshly prepared GQDs solution. The crystal structure of $Cs_2SnCl_6$ corresponds to a vacancy-ordered double perovskite structure with isolated [$SnCl_6$] octahedral.

X-ray diffraction (XRD) patterns 10% Bi doped $Cs_2SnCl_6$NPs included sharper peaks compared to undoped $Cs_2SnCl_6$NPs. The major XRD peaks position of $Cs_2SnCl_6$:Bi NPs were slightly shifted to lower 2θ values as compared to the undoped $Cs_2SnCl_6$ NPs. It is contemplated that this shift is due to the substitution of Sn of ionic radius 225 pm by atoms Bi that have larger ionic radius (230 pm).

Figure 3:
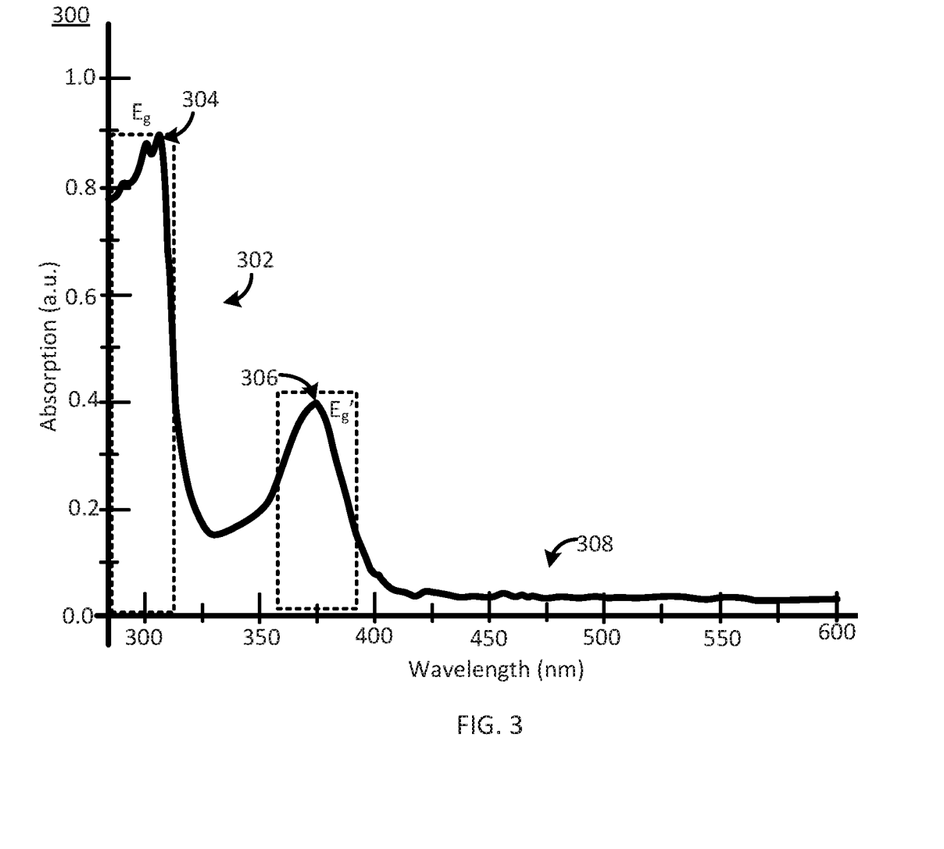
FIG. 3 is a plot illustrating a UV-visible absorption spectrum of one example photoactive layer material, according to the present disclosure.

FIG. 3 is a plot 300 illustrating a UV-visible absorption spectrum 302 of one example photoactive layer material, according to the present disclosure. The UV-visible absorption spectrum of the example $Cs_2SnCl_6$:Bi NPs was captured under ambient atmosphere. The UV-visible absorption spectrum 302 of the example $Cs_2SnCl_6$:Bi NPs includes a relatively sharp optical absorption edge 304 at 315 nm (3993 eV (electron-volts)). It is contemplated that the sharp edge may be due to the intra band transition from a valance band maximum (VBM) to a conduction band minimum (CBM). The UV-visible absorption spectrum 302 of the example $Cs_2SnCl_6$:Bi NPs includes a second absorption peak 306 at around 375 nm (3.31 eV). The second peak 306 corresponds to transition from a new VBM (VBM') including Cl 3p and Bi 6s orbitals to the $Cs_2SnCl_6$ host CBM. The UV-visible absorption spectrum 302 of the example $Cs_2SnCl_6$:Bi NPs illustrates that the example photoactive layer material, according to the present disclosure, is visible-blind, as indicated by region 308 for wavelengths between about 425 nm and at least 600 nm.

Figure 4:
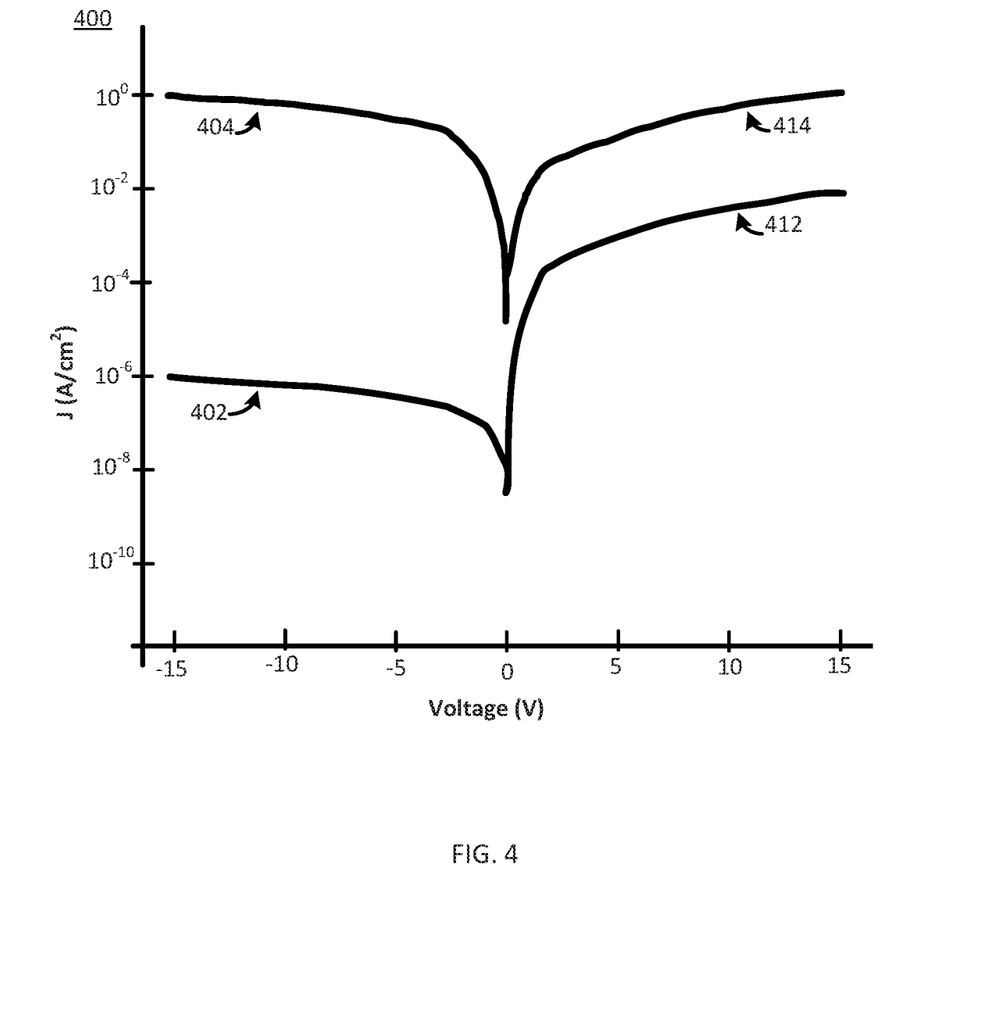
FIG. 4 is a plot illustrating current density (J) versus voltage (V) measured in the dark and with 280 nm UV illumination of one example hybrid fiber photodetector, according to the present disclosure.

FIG. 4 is a plot 400 illustrating current density (J) versus voltage (V) measured in the dark and with 280 nm UV illumination of one example hybrid fiber photodetector, according to the present disclosure. In the plot 400, a first dark current 402 and a first photocurrent 404 were measured for a bias voltage in the range of 0 to −15 V corresponding to an operating voltage of less than or equal to 15 V. A second dark current 412 and a second photocurrent 414 were measured for a bias voltage in the range of 0 volts to +15 V. The dark currents 402, 412 of the example photodetector have a rectification characteristic with a rectification ratio of 247 when biased at ±5V, Upon UV illumination, the hybrid fiber UV photodetector demonstrates a photocurrent 404 to dark current 402 ratio of more than 6 orders of magnitude when biased at −15V, The rectification characteristics and the photocurrent to dark current ratio of this photodetector may be attributed to interfacial charge-valve controlled hole injection mechanism, as described herein. Thus, a hybrid fiber photodetector, consistent with the present disclosure may achieve a relatively low dark current density and a photocurrent density of a number (e.g., 6) of orders of magnitude greater than the dark current density at a supply voltage of less than 20 volts.

Photoresponsivity spectra (defined as the photo-current per unit incident optical power) and external quantum efficiency (EQE) of the example hybrid fiber UV photodetector were measured with bias voltages varying over a range of about −3 V to −15 V (i.e., operating voltage over a range of about 3 V to 15 V). A maximum photoresponsivity of 1902 A/W and EQE of $4.62 \times 10^5$% were achieved at a wavelength of 320 nm (3.88 eV). A clear cut-off in both photoresponsivity and EQE was evident at a wavelength of approximately 380 nm. The cut-off wavelength agrees with the 375 nm absorption peak of the optical absorption spectrum of FIG. 3. It may be appreciated that the absorption peak may originate from the transition from the VBM' with Cl 3p and Bi 6s orbitals to the $Cs_2SnCl_6$ host CBM. The photoresponsivity measured at this cut-off wavelength (375 nm) are 1617 A/W (corresponding to EQE $3.93 \times 10^5$%) while at wavelength of 400 nm and beyond the photoresponsivity dropped to less than 21 A/W, indicating an excellent UV to visible rejection capability of this example photodetector.

To describe the J-V rectification characteristics of the dark current and the relatively high photoresponsivity/EQE of this photodetector, reference is made to the energy band diagrams illustrated in FIGS. 2A and 2B. When in dark and under reverse bias condition, the hole blocking ability of BCP (i.e., the second layer 125), together with the relatively large band offset between the HOMO of BCP and work function of GQDs, may impede hole injection from the GQDs anode (i.e., transparent electrode 130). Similarly, electron injection from the graphene fiber (i.e., conductor 110) may be suppressed due to the electron blocking ability of $MoO_3$ (i.e., first layer 115) together with the large band offset between the work function of graphene and the conduction band minimum of $MoO_3$. Such carrier injection blocking capability from both inner and outer electrodes under reverse biased condition may effectively suppress the dark current, which facilitates achieving relatively low noise and relatively high detectivity. In contrast, when the hybrid fiber photodetector is forward biased, the electrons may be injected from GQDs to BCP and holes may be injected from the graphene fiber to $MoO_3$ relatively easily, resulting in a higher dark current as compared to the reverse biased condition.

Upon UV illumination, the $Cs_2SnCl_6$:Bi NPs (i.e., first submaterial) in the photoactive layer (i.e., photoactive layer 120) may absorb incident photons and generate electron-hole pairs. The photogenerated holes from $Cs_2SnCl_6$:Bi NPs can be transported through TAPC (i.e., second submaterial) and $MoO_3$, and finally be collected from the graphene fiber under external bias voltage (i.e., supply voltage). In contrast, the photogenerated electrons may remain confined in the $Cs_2SnCl_6$:Bi NPs due to lack of a percolation network for electrons and the relatively strong electron confinement effect of the TAPC-$Cs_2SnCl_6$:Bi NPs photoactive composite layer (i.e., large band offset between the LIMO of TAPC and CBM of $Cs_2SnCl_6$, together with TAPC's electron blocking capability can effectively confine the photogenerated electrons in the photoactive composite layer). The confined electrons may accumulate and relatively quickly shift the LIMO of the TAPC downwards and align the Fermi level of the composite layer with that of the GQDs. Thus, the hole-injection barrier on the CODs side may become relatively thin and the holes may relatively easily tunnel through the hole-injection barrier with assistance of a small reverse bias, resulting in a relatively large increase of photo-induced hole-injection current (which is understood to be a main contributor for the greater than $10^6$ photocurrent to dark current ratio as well as the relatively high photoresponsivity/EQE). Accordingly, the GQDs-BCP interface may act as a 'charge-valve' for hole injection that is controlled by operation of the TAPC-$Cs_2SnCl_6$:Bi NPs photoactive composite layer. Thus, the incident photons may turn on the charge-valve.

The linear dynamic range (LDR) of a photodetector indicates that, within a certain range, the photodetector has a linear response to varying incident light intensity and may maintain a constant responsivity. LDR may be expressed as:

$$LDR = 20 \log(P_{sat}/P_{low})$$

where $P_{sat}$ and $P_{low}$ correspond to the upper and lower limit, respectively, of the incident light intensities. Beyond this range the photocurrent may deviate from linearity. The LDR of the example hybrid fiber UV photodetector was evaluated by measuring the photocurrent under 280 nm UV illumination with varying light intensity from $2.4 \times 10^{-3}$ W/cm² (Watts per centimeter squared) to $1.3 \times 10^{-9}$ W/cm². By linearly fitting the data, it was found that the R-square (coefficient of determination) of the linear fitting was 0.99996. No deviation from linearity of the photocurrent was observed, corresponding to a minimum LDR of 125 dB for the example hybrid fiber UV photodetector. Thus, a hybrid fiber UV photodetector, consistent with the present disclosure, may have a linear dynamic range on the order of 100 dB.

A response speed measurement of the example hybrid fiber UV photodetector was performed under a 280 nm short pulse (100 kHz (kilohertz)) light from a LED (light emitting diode). A normalized response vs. light pulse frequency of the example hybrid fiber UV photodetector was determined. The 3-dB bandwidth was measured to be 3.1 MHz (megahertz), With respect to transient response, the rise time (i.e., output signal changing from 10% to 90% of the peak output value) and the decay time (i.e., output signal changing from 90% to 10% of the peak output value) of the photocurrent were 624 ns and 643 ns, respectively. Thus, a hybrid fiber UV photodetector, consistent with the present disclosure, may have a response time of less than one microsecond.

As is known, the specific detectivity, a figure-of-merit for photodetectors, characterizes the capability of a photodetector to detect the weakest light signal. The specific detectivity ($D^*$) can be expressed as:

$$D^* = \frac{(AB)^{1/2}}{NEP} \text{ (Jones)}$$

$$NEP = \frac{i_n}{R} \text{ (W)}$$

where the NEP is the noise equivalent power, B is the bandwidth, A is the area of the device, $i_n$ is the measure noise current, and R is the photoresponsivity of the photodetector. The dark current of the example hybrid fiber UV photodetector was as low as 3.6 nA (nano amperes) at bias voltage of −15 V. It is contemplated that the relatively low dark current is due to the carrier injection blocking capability at both cathode and anode corresponding to a relatively, low shot noise. To include other possible noise, such as flicker noise and thermal noise, the total noise current of the photodetector was measured at different dark current levels and at various frequencies (range from 1 Hz to 5 kHz). The detectivity of the example hybrid fiber UV photodetector was calculated at different wavelengths with the measured noise current and responsivity at −15 V bias. The maximum specific detectivity of the example hybrid fiber UV photodetector reached approximately $2.29 \times 10^{15}$ jones at 324 nm, and was above $1.5 \times 10^{15}$ jones in the UV region for wavelength from 380 nm to 280 nm, Thus, a hybrid fiber UV photodetector, consistent with the present disclosure, may have a detectivity on the order of $10^{15}$ jones.

Flexibility and mechanical durability of a photodetector may be considerations for practical applications. The flexibility of the example hybrid fiber photodetector was assessed by measuring the optoelectronic performance of the device at +/−45° bending angles for more than 300 cycles. Statistical analysis showed that the standard deviation (1σ) of the measured photocurrent was 0.007 A/cm², which is less than 1% of photocurrent data population mean value (0.873 A/cm²). All the data points were located within +/−3σ limit, illustrating the mechanical flexibility and durability of the photodetector. The tensile strength of the example hybrid fiber photodetector was measured. A tensile strength of 760 MPa (megapascal) was achieved for the example hybrid fiber UV photodetector.

Example Method

An example hybrid fiber UV photodetector, consistent with the present disclosure was constructed and tested, as described herein. One nonlimiting example process for constructing the example hybrid fiber UV photodetector is described below. However, this disclosure is not limited in this regard.

Large-sized GO (LGGO) and small-sized GO (SMGO) were prepared from graphite powders following a modified Hummers's method. The graphite intercalation compounds were expanded at 750 W by microwave irradiation for 90 seconds to get worm-like expanded graphite. The expanded graphite powder (5 g), concentrated $H_2SO_4$ (300 mL), $K_2S_2O_8$ (4.2 g) and $P_2O_5$ (6.2 g) were added successively into a flask (500 mL) and the mixture was kept at 80° C. for 24 h. After cooling to room temperature, the mixture was diluted with de-ionized (DI) water then vacuum-filtered and washed with DI water until pH neutral. The expanded graphite powder was dried in air at room temperature for 2 days. After drying, the expanded graphite (5 g) was added to a mixture containing concentrated $H_2SO_4$ (115 mL) and $NaNO_3$ (2.5 g) in an ice bath (0° C.). $KMnO_4$ (15 g) was then added carefully to the solution and maintained for 30 minutes (rains) at 35° C. followed by a slow addition of DI water (230 mL). The temperature of the reaction was maintained at 98° C. for 15 mins. Additional DI water (355 mL) containing $H_2O_2$ (3 wt %, 50 mL) was added. The solid obtained from centrifugation (3200 rpm, 5 mins) was washed with excess DI water, 20 vol. % HCl, and ethanol. The washing process was repeated several times until the pH of the solution reached neutral to get the final concentrated LGGO dispersion. To get SMGO, the diluted LGGO dispersion was sonicated by a probe sonication instrument at 500 W for 1 h. 5 ml LGGO and SMGO dispersions were dried at 60° C. and the solid was collected and weighted in order to measure the concentration of GO dispersions. The LGGO and SMGO dispersions were mixed with a ratio of 7:3 and heated at 120° C. to evaporate water and concentrate the GO dispersion for the fiber spinning. GO spinning solution (15 mg/mL) was injected into rotating hexadecyltrimethyl ammonium bromide or calcium chloride coagulation baths from a plastic syringe. After a 30 min immersion in coagulation baths, the GO gel fibers were washed with DI water and suspended over two parallel rods in the air to dry for 1 h. As-spun GO fibers were fixed on a graphite fixture and annealed using an electrical furnace. The samples were heated up from room temperature to 1100° C. at a rate of 1000° C./h and maintained at this temperature for 1 h in a flow of argon.

CsCl (337 mg, 2 mmol) was dissolved in 5 mL methanol. In a separate 25 mL beaker, $SnCl_4 \cdot 5H_2O$ (351 mg, 1 mmol) with $BiCl_3$ (31.5 mg, 0.1 mmol) was mixed and dissolved in 5 mL methanol to afford a clear transparent solution. Addition of the alcoholic mixture solution to the CsCl solution under vigorous stirring at room temperature led to spontaneous precipitation of white powder. The mixture was stirred for a further 30 min to ensure completion of the reaction, after which the solid was washed by methanol in a centrifuge at 3000 RPM for 5 min twice. Then the obtained powder was dried in an oven at 80° C. overnight.

Graphene quantum dots were synthesized by cutting a graphene sheet (GS) through a hydrothermal method. First, the GS was synthesized through thermal exfoliation of graphene oxide. Next, the GS were oxidized in concentrated $H_2SO_4$ and $HNO_3$ (volume ratio: 1:3) for 20 h (hours) under ultrasonication (500 W, 40 kHz). The mixture was then diluted with deionized (DI) water and filtered through a 0.22 micrometer membrane. Oxidized GSs were dissolved in DI water and the pH was tuned to 8 using $NH_3 \cdot H_2O$. Then, the solution was treated through hydrothermal process in a Teflon-lined Parr autoclave at 200° C. for 10 h. After cooling down to room temperature, the solution was filtered through a 0.22 micrometer membrane. Finally, a light-yellow solution containing fluorescent GQDs was obtained after a process of dialysation. The fabricated GQDs can be retained stably in water for several months.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A hybrid fiber for detecting ultraviolet (UV) light, the hybrid fiber comprising:
    a conductor comprising a conductive material;
    a first layer comprising a first material deposited onto the conductor, the first material configured to transport holes and block electrons;
    a photoactive layer comprising a photoactive material coating the first layer, the photoactive material comprising a first submaterial and a second submaterial;
    a second layer comprising a second material deposited onto the photoactive layer, the second material configured to block holes and transport electrons; and
    a transparent electrode comprising a transparent electrode material deposited onto the second layer,
    wherein, in an operation, with a reverse bias voltage across the conductor and the transparent electrode, when the hybrid fiber is not illuminated by UV light, the second layer and the transparent electrode are configured to impede an injection of holes, and the conductor and the first layer are configured to impede an injection of electrons, resulting in a dark current corresponding to a dark current density less than or equal to a threshold of the dark current density, and
    when the hybrid fiber is illuminated by UV light, the second layer and the transparent electrode are configured to allow an injection of holes in response to an operation of the photoactive layer, resulting in a photocurrent density of at least three orders of magnitude greater than the threshold of the dark current density.

2. The hybrid fiber of claim 1, wherein the threshold of the dark current density is in a range of $10^{-6}$ to $10^{-5}$ A/cm$^2$ (amperes per centimeter squared).

3. The hybrid fiber of claim 1, wherein the first submaterial is a wide bandgap semiconductor material and the second submaterial is configured to transport holes and to block electrons.

4. The hybrid fiber of claim 1, wherein an operating voltage corresponding to the reverse bias voltage is less than 20 volts.

5. The hybrid fiber of claim 1, wherein the conductor is flexible.

6. The hybrid fiber of claim 1, wherein the conductive material is selected from the group consisting of graphene, poly(3,4-ethylenedioxythiophene) polystyrene sulfonate ("PEDOT/PSS"); poly[2-methoxy-5-(2-ethylhexyloxy)-1,4-phenylenevinylene] ("MEH-PPV"), metal or a carbon nanotube; the first material is selected from the group consisting of molybdenum trioxide ($MoO_3$), 2,2',7,7'-Tetra(N,N-di-p-tolyl)amino-9,9-spirobifluorene ("Spiro-TTB"); N,N'-Bis(naphthalen-1-yl)-N,N'-bis(phenyl)-benzidine ("NPB"); N,N'-Bis(3-methylphenyl)-N,N'-bis(phenyl)-benzidine ("TPD"), nickel oxide (NiO), copper oxide (CuO); the photoactive material first submaterial is selected from the group consisting of $Cs_2SnCl_6$, $Cs_2SnCl_6$ doped with Bismuth (Bi), Indium oxide ($In_2O_3$), Tungsten oxide ($WO_3$); the photoactive material second submaterial is selected from the group consisting of poly(N-vinylcarbazole) (PVK), Spiro-TTB, NPB, TPD, NiO, CuO, 1,1-bis[(di-4-tolylamino)phenyl]cyclohexane (TAPC); the second material is selected from the group consisting of bathocuproine ("BCP"), Bathophenanthroline ("BPhen"), Diphenyl[4-(triphenylsilyl)phenyl]phosphine oxide ("TSPO1"), Titanium dioxide ($TiO_2$); and the transparent electrode material is selected from the group consisting of a carbon nanotube network, graphene, tin-doped indium oxide ("ITO"); aluminium-doped zinc oxide ("AZO"), fluorine-doped tin oxide ("FTO").

7. The hybrid fiber of claim 1, wherein the photoactive layer is coated onto the first layer by a coating process selected from the group consisting of dip, spin, spray, electrochemical, and self-adsorption.

8. The hybrid fiber of claim 1, wherein the first submaterial comprises a perovskite material.

9. The hybrid fiber of claim 8, wherein the perovskite material comprises $Cs_2SnCl_6$.

10. The hybrid fiber of claim 9, wherein the perovskite material further comprises bismuth (Bi).

11. The hybrid fiber of claim 8, wherein the second submaterial is PVK (poly(N-vinylcarbazole)) or TACP (1,1-bis[(di-4-tolylamino)phenyl]cyclohexane).

12. A hybrid fiber for detecting ultraviolet (UV) light, the hybrid fiber comprising:
    a conductive fiber comprising a graphene material;
    a first layer comprising molybdenum trioxide ($MoO_3$) deposited onto the conductive fiber, the $MoO_3$ configured to transport holes and block electrons;
    a photoactive layer comprising a photoactive material coating the first layer, the photoactive material comprising a perovskite material and poly(N-vinylcarbazole) (PVK) or 1,1-bis[(di-4-tolylamino)phenyl]cyclohexane (TAPC);
    a second layer comprising a bathocuproine ("BCP") material deposited onto the photoactive layer, the BCP material configured to block holes and transport electrons; and
    a transparent electrode comprising a multiwall carbon nanotube material or a graphene quantum dot material, the transparent electrode deposited onto the second layer, wherein, in an operation, with a reverse bias voltage across the conductive fiber and the transparent electrode, when the hybrid fiber is not illuminated by UV light, the second layer and the transparent electrode are configured to impede an injection of holes, and the conductive fiber and the first layer are configured to impede an injection of electrons, resulting in a dark current corresponding to a dark current density less than or equal to a threshold of the dark current density, and when the hybrid fiber is illuminated by UV light, the second layer and the transparent electrode are configured to allow an injection of holes in response to an operation of the photoactive layer, resulting in a photocurrent density of at least three orders of magnitude greater than the threshold of the dark current density.

13. The hybrid fiber of claim 12, wherein the threshold of the dark current density is in a range of $10^{-6}$ to $10^{-1}$ A/cm$^2$ (amperes per centimeter squared).

14. The hybrid fiber of claim 12, wherein an operating voltage corresponding to the reverse bias voltage is less than 20 volts.

15. The hybrid fiber of claim 12, wherein the conductive fiber is flexible.

16. The hybrid fiber of claim 12, wherein the photoactive layer is coated onto the first layer by a coating process selected from the group consisting of dip, spin, spray, electrochemical, and self-adsorption.

17. The hybrid fiber of claim 12, wherein the perovskite material comprises $Cs_2SnCl_6$.

18. The hybrid fiber of claim 17, wherein the perovskite material further comprises bismuth (Bi).

* * * * *

UNITED STATES PATENT AND TRADEMARK OFFICE
CERTIFICATE OF CORRECTION

| | | |
|---|---|---|
| PATENT NO. | : 12,152,935 B2 | Page 1 of 1 |
| APPLICATION NO. | : 17/429822 | |
| DATED | : November 26, 2024 | |
| INVENTOR(S) | : Dali Shao, Shayla Maya Sawyer and Jie Lian | |

It is certified that error appears in the above-identified patent and that said Letters Patent is hereby corrected as shown below:

In the Claims

Column 15, Claim 13, Line 18, reads as "$10^{-6}$ to $10^{-1}$" but should be "$10^{-6}$ to $10^{-5}$".

Signed and Sealed this
Twenty-seventh Day of January, 2026

John A. Squires
*Director of the United States Patent and Trademark Office*